United States Patent [19]

Yamazaki

[11] 3,967,981
[45] July 6, 1976

[54] METHOD FOR MANUFACTURING A SEMICONDUCTOR FIELD EFFORT TRANSISTOR

[76] Inventor: Shumpei Yamazaki, 20-7, 1-chome, Shinkawa, Shizuoka, Japan

[22] Filed: June 25, 1975

[21] Appl. No.: 590,082

Related U.S. Application Data

[60] Continuation of Ser. No. 575,032, May 5, 1975, abandoned, which is a continuation of Ser. No. 407,878, Oct. 19, 1973, abandoned, Division of Ser. No. 213,998, Dec. 30, 1971, abandoned.

[30] Foreign Application Priority Data

Jan. 14, 1971  Japan.............................. 46-000799
Jan. 14, 1971  Japan.............................. 46-000798

[52] U.S. Cl................................ 148/1.5; 148/187; 148/188; 148/175; 204/15; 29/571; 357/23; 357/67
[51] Int. Cl.².......................................... H01L 7/34
[58] Field of Search ............ 148/1.5, 175, 187, 188; 204/15; 29/571; 357/23, 67

[56] References Cited

UNITED STATES PATENTS

| | | | |
|---|---|---|---|
| 3,445,732 | 5/1969 | Janning............................ | 357/23 X |
| 3,541,676 | 11/1970 | Brown............................... | 29/571 |
| 3,646,665 | 3/1972 | Kim................................... | 148/187 X |
| 3,673,679 | 7/1972 | Carbajal et al. ................ | 148/187 X |
| 3,696,276 | 10/1972 | Boland............................. | 148/187 X |

*Primary Examiner*—G. Ozaki
*Attorney, Agent, or Firm*—Holman & Stern

[57] ABSTRACT

A method of manufacturing a metal, insulator, semiconductor type field effect transistor (MISFET) is disclosed by which a device is obtained having greatly improved reliability and containing multi-layered wiring. Only three photo-mask processes are used and the requirement for precision mask aligning is eliminated.

7 Claims, 17 Drawing Figures

(A)

(B)

(C)

(D)

(E)

(A)

(B)

(C)

(D)

(E)

(A)

(B)

METHOD FOR MANUFACTURING A SEMICONDUCTOR FIELD EFFORT TRANSISTOR

RELATED CASES

This is a continuation of application Ser. No. 575,032 filed May 5, 1975, which was a continuation of application Ser. No. 407,878 filed Oct. 19, 1973, which in turn was a division of application Ser. No. 213,998 filed Dec. 30, 1971. All such prior applications are now abandoned in favor of the instant application and application Ser. No. 427,116 filed Dec. 21, 1973, now abandoned, which was a continuation of said application Ser. No. 213,998.

A conventional MISFET having an aluminium gate requires at least four photo-mask processes during fabrication. The present invention provides an improved structure requiring only three photo-mask processes and no precision mask aligning, thereby making feasible a high production rate, yielding a good quality product and of the appropriate size for use in integrated circuits (IC) and large scale integrated circuits (LSI).

The present invention relates to a semiconductor device of the sandwich-structured metal, insulator, semiconductor type field effect transistor (MISFET). Its principal objects are to more easily fabricate the device, to increase its reliability, and to realize multi-layered wiring.

A conventional MISFET having a gate made of aluminium has previously required four photo-mask processes during fabrication. Also, the production rate yielding good quality and reliability is poor because the process is not self-aligning and thus the locations of the regions of gate electrode, gate insulating coating, source and drain, are not determined automatically.

A silicon gate MISFET, the product of recent developments, has self-aligning features and the regions and locations of the insulating coating, source and drain are automatically aligned with the gate. However, it still requires four photo-mask processes to be carried out, such as described in U.S. Pat. 3,475,234 issued Oct. 25, 1969 to R. E. Kerwin et al. Particularly, the precision masking required for aligning the openings for source and drain electrodes is a very difficult process thus making the production rate very low.

True multi-layered wiring is not attained by the silicon gate MISFET. The gate is surrounded by a silicon oxide coating processed through chemical vapor deposition (CVD). This makes the silicon gate MISFET resistant to shock, but, it has no provision against penetration of alkaline ions. Thus, the silicon gate MISFET as heretofore known, requires packaging or the equivalent as an enclosure.

SUMMARY OF THE INVENTION

The present invention provides an improved structure over MISFETS prepared in accordance with known semiconductor device technology. The regions of the gate in the present invention including the gate electrode and a mono-layer or multi-layer of an insulating coating are to be surrounded by alumina or titanium oxide. The present invention requires no precision mask aligning and only three photo-mask process steps. The invention provides basic structure making through-multi-layered wiring feasible. The possible wiring of leads in the second layer above the MISFET by the teaching of the present invention reduces the size of integrated circuits (IC) or large scale integrated circuits (LSI) about by half of those using a conventional MISFET, while maintaining the necessary internal elements thereof the same.

DESCRIPTION OF THE FIGURES

The invention may be better understood from the following illustrative description with reference to the accompanying drawings.

DISCUSSION OF THE PREFERRED EMBODIMENT

Embodiment 1

Figure 1:
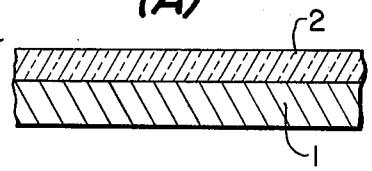
FIG. 1 (A–E) and FIG. 2 (A–E) of the drawings show greatly enlarged cross sections of each step in the process in accordance with the present invention.
Figure 1:
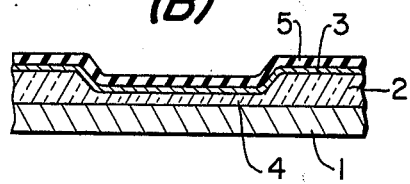
Figure 1:
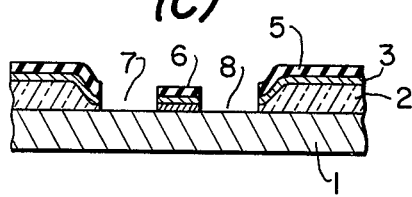
Figure 1:
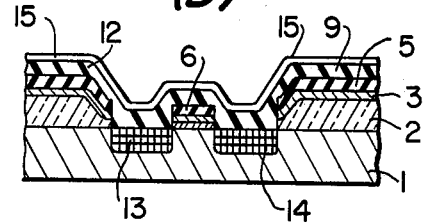
Figure 1:
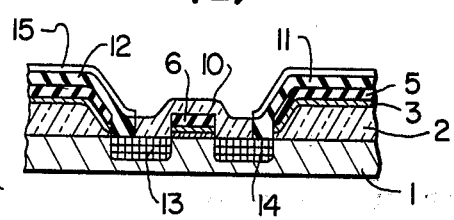

FIG. 1 illustrates steps of fabrication of the device according to the present invention. In FIG. 1(A), a silicon semiconductor of N-type having $P_o = 10^{15} - 10^{16} \text{cm}^{-3}$ with a 100 crystal orientation is used for the substrate represented at 1. The conduction type and the impurity concentration are to be selected in accordance with the desired application. The silicon oxide coating 2 in FIG. 1(A) of 4000A to $1\mu$ in thickness is processed by chemical vapor deposition (CVD) with silane and oxygen at about 400°C or through thermal oxidation at about 1000°C to 1200°C in moisture or wet oxygen.

As shown in FIG. 1(B), the oxide coating 2 constituting a portion of an FET, is removed by a photo-etching process and the silicon oxide coating 4 is formed through oxidation in dry oxygen. Then, a silicon nitride coating 3 is formed above the coating 4.

The thickness of the coatings 3 and 4 differs depending on the desired application of the device. In general, the total thickness of 3 and 4 is 500 to 3000A. The material of the insulator coating 3 and 4 may, in alternate embodiments, be changed from silicon oxide and silicon nitride to phosphosilicate glass (PSG), alumina, tantalum oxide or titanium oxide, etc. depending on the desired application of the device. The processing of these materials are well-known in the art and will not be further discussed here.

In the next step, a semiconductor or metal layer 5 having high melting point is deposited as the gate material on the above insulator coating 3, 4. If layer 5 is to be a semiconductor it should be composed of the same kind of material as the substrate 1 and may be fabricated through the CVD process. For example, highly boron-doped silicon of $10^{20}$ to $10^{22} \text{cm}^{-3}$ is processed by thermal decomposition of silane from about 3000A to 1 micron thick. The use of a metal such as aluminum for the gate is not feasible because its work function is low and melting point is not sufficiently high. Consequently, materials with high work functions and high melting points, such as a mono-layer coating of molybdenum, tungsten, tantalum, or titanium in addition to the highly doped silicon described above or beryllium, are desirable for the gate.

If the source and the drain are to be produced by thermal diffusion right after the Step (B) of FIG. 1, the use of molybdenum, tungsten or tantalum is desirable for the gate material.

However the basic requirements of the material for the electrode contacting the source and drain is that it not react with the gate insulators, not diffuse into the gate insulators, not react with the surrounding metals, have a certain measure of masking effect and be oxidized with difficulty. Having selected a material for layer 5 conforming to these requirements, the Step (B) of FIG. 1 is completed.

Step (C) of FIG. 1 shows the fabrication of the openings 7 and 8 for the source 13 and drain 14 respectively and of the delineation of leads 5 by the photo-etching about the periphery of the source and drain. The bottom of the lead 5 reduces the sheet resistance of the lead 12, 11 effectively. However, this configuration imposes high precision alignment upon the third masking.

The FIG. 1(D) has a metal coating 9 overlying layer 5 of the FIG. 1(C). The material of the metal coating may be the same as the substrate, such as highly doped silicon or it may be a metal coating such as aluminum or titanium. When the highly doped silicon is used as the coating, 9 the type of conduction has to be identical to that of the source 13 and drain 14. Also, the surface of the gate electrode has to be overlayed by stable material layer 15 such as molybdenum or tungsten, to prevent oxidation, even when doped poly-silicon semiconductor is used as the gate material. In this case, a double layered gate electrode is produced by silicon and molybdenum, or silicon and tungsten. Alternately, a single layered gate electrode may be made by using molybdenum or tungsten. After the coating 9 is deposited on the structure of step C of FIG. 1, the material 15, which has a masking effect against thermal oxidation and/or anodic oxidation, is applied to overlay the coating 9 as shown in Step (D) of FIG. 1. In this embodiment silicon nitride, tungsten or molybdenum has been used as the coating 15. A coating 15 is also used when the metal layer 9 is composed of titanium.

Then, as shown on the FIG. 1(E) the unnecessary portion of the coating 15 is removed by photo-etching. Thus, the leads and electrodes 12, 11 for the source 13 and drain 14 respectively, and regions to function as leads connected to the gates are left after the photo-etching. The remaining material coating has to be situated over the bottom of leads 5.

Spacing and electrical isolation between surroundings 10 and the leads are performed in the next step. In the embodiment, photo-etching is used for this. For aluminum leads of 12, 11, potassium hydroxide or hydrochloric acid is used as the etching solution. In the case of potassium hydroxide, as it exposes the gate region to the surroundings, a masking coating 15 is required on the leads 12, 11. After finishing Step (E) of FIG. 1, the present embodiment shown in FIG. 1(E), the upper side of the gate region 10, is covered with a silicon nitride coating which is formed for the passivation of the device at a lower temperature of 450°C to 550°C. This technique is applicable to every embodiment in the present invention as the final step of the coating process so as to ensure protection against deterioration. If only mono-layered wiring is required, the step of fabrication for coating 15 is omitted and the unnecessary portion of the metal coating is removed by photo-etching. Finally, protection against deterioration is applied, if required.

The step shown in FIG. 1 (E) uses thermal oxidation or anode oxidation instead of the photo-etching. In the case of anode oxidation, photoresist and the coating 15 are masked and then oxidation is applied putting the device to the anode side. Methyl alcohol, isopropyl alcohol, oxalic acid and formic acid have been used in the embodiment as an oxidation solution. The coating 9 can be most quickly oxidized when alcohol is used. The resultant coating is porous, however but this makes no problem.

In case an aluminum coating 9 is used for the lead 12, 11 in FIG. 1(D), the portion represented at 10 changes into aluminum oxide preventing the penetration of alkali ion into the gate. The device is protected from degradation from the outside and the reliability of each element thereof is further increased.

When highly doped silicon is used for the lead 9 and if the impurity is P-type such as boron, the above anode oxidation is used successively. However, if the impurity is N-type, thermal oxidation with water vapor or wet oxygen at 950°C to 1050°C has to be employed. Needless to say, P-type highly doped polycrystalline silicon can be oxidized by both thermal oxidation and anodic oxidation. Since the leads 11 and 12 are polycrystalline, the speed of oxidation is two times faster than that for a single crystal. Also, no deterioration of the element was observed during the experiment of the present embodiment.

EMBODIMENT 2

Figure 2:
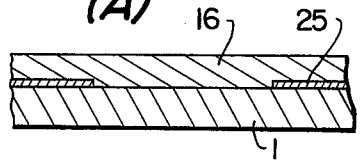
Figure 2:
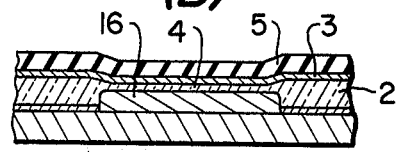
Figure 2:
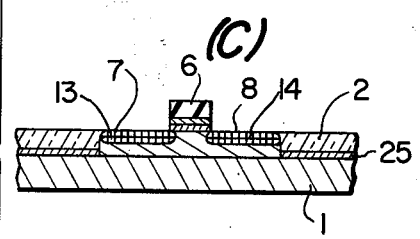
Figure 2:
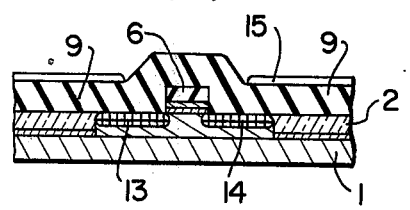
Figure 2:
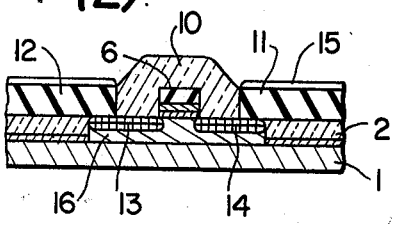

FIG. 2 illustrates the steps of the process of the second embodiment. In the FIG. 2(A) the substrate 1 is a P-type silicon with a 100 crystal orientation. On the surface of the substrate 1, silicon oxide or silicon nitride coating 25 is deposited in a mono-layer or multilayer having a thickness of 500 to 3000 A. Then, a portion of the coating 25 on the substrate is removed for the production of the MISFET.

After removal, the silicon coating 16 having a thickness of 0.5 to 10 microns is deposited by an epitaxial process using silane or silicon tetrachloride. Consequently, the silicon coating above the portion represented at 25 of FIG. 2(A) has a polycrystalline structure. The coating is doped with boron to $10^{15}$ to $10^{16} cm^{-3}$. The type of conductor for the substrate 1 and coating 2 and the density of impurity is determined depending on the desired application.

The device is then subjected to thermal oxidation at 1000°C to 1150°C. Since the coating 2 has single crystals of 100 crystal orientation, the speed of oxidation is about half that of silicon having a 111 crystal orientation. Then, the polycrystalline portion of the layer 16 above the coating 25 offers a speed of oxidation greater by a factor of 2 to 3 than an epitaxial layer. The porous property of the polycrystalline silicon is essential; however the ratio of porosity with respect to monocrystalline silicon differs depending on the processing.

Then, the Step (A) of FIG. 2 is subjected to thermal oxidation to produce the silicon oxide layer 2 of 2000 to 3000A thickness and the portion represented at 4 of 1000A thickness as shown in FIG. 2(B). Thus the total thickness of the combined coatings 2 and 25 significantly reduces stray capacitance between the lead 5 above the coating 2 and the substrate. Alternatively if after the thickness of the portion represented at 4 is determined, the thickness of the semiconductor portion represented at 16 is determined, then the thickness of the coating 2 may be decided. To reduce the stray capacitance more significantly, the thickness of the coating 25 is determined in accordance with the thickness of the silicon oxide layer 2. When the thickness of the silicon oxide coating at the portion represented at 4 is thin enough, for example, less than 300A thick, the steps shown in the illustrations are not effective. At any rate, inverse biasing isolation between the substrate 1 and the semiconductor layer 2 and dielectric isolation at the periphery of the layer 2 are very effective measures to eliminate the stray capacitance to be yielded at the drain of the FET. When the portion represented at the point 16 of FIG. 2(B) is processed by silicon tetrahcloride only, the silicon layer above the coating 25 becomes thinner compared to the region of single crystal silicon because selective epitaxial growth has taken place. As a result, epitaxial growth by mixed silane and silicon tetrachloride is desirable for the processing of the coating 2.

The thickness of the coating 3 is 400 to 2000A. The coating 3 in FIG. 2(B) may be composed of a cluster-free silicon nitride, phosphosilicate glass, aluminum oxide, tantalum oxide or titanium oxide, etc. in monolayer or in multi-layer above the coating 4.

Also, a cluster or coating made of either silicon or germanium may be placed between the coatings 4 and 3. The cluster looks like a bunch of grain and each grain has a diameter ranging from tens of Angstroms to 1500A. Thus, this semiconductor cluster or coating is at a floating electrical potential. Holes or electrons energized by zener or avalanche plasma generated around the drain due to tunnel current or Schottky current from the substrate, apply a negative or positive voltage to the gate causing the tunnel current or Schottky current to flow there. A part of or all of the current can be directed into the semiconductor cluster or coating for trapping. The electric charge to be trapped in the cluster or coatimg is used for nonvolatile memory. The material and thickness of the coatings 3 and 4 are subject to change depending on the application of the device.

Above the coating 3, silicon, germanium or metal in a mono-layer or in multi-layer is processed to form a gate electrode layer 5. In the case of a germanium electrode it should be made of P-type highly doped germanium with molybdenum or tungsten on its surface for oxidation protection. In the case of doped silicon, the type of conduction should be P-type. The most desirable is $P^+$ type highly doped to shift the threshold voltage (Vth) in MISFET operation in the positive direction. Above the silicon-doped gate, silicon nitride as insulating material or molybdenum, tungsten, tantulum, etc. as metal material is processed with a thickness of 1000 to 3000A, for masking. This coating should have a masking effect against anode oxidation as shown on the Step (E) in FIG. 2. In the case of metal, a three-layered structure consisting of platinum, titanium and either tungsten or tantalum from the gate insulator side will obtain the most favorable result. Because the platinum has a work function of 5.35 eV, it is the most effective material to shift the threshold voltage Vth in the positive direction or to reduce it. However, above 300°C the platinum diffuses inside the silicon nitride coating or silicon oxide coating. Therefore, it is required to use an ion implantation technique as shown in the step (C) right after the completion of the source, drain and gate 6.

Titanium, tungsten, molybdenum and tantalum have been examined for the gate electrode metal 5. Those materials having high melting points and high work functions are desirable because of their high oxidation resistance.

Then, the metal layers 5 and coating 3 are removed by photo-resist except the portion of the gate 6. In this process, a part of the surface of the silicon oxide coating 2 is photolithographically etched. Also, the impurity diffusion for masking the opposite conductivity region to the substrate 16 for the source and drain takes place. These are shown in the step (C) of FIG. 2.

FIG. 2 (D) is obtained depositing the coating 9 of aluminum or titanium on the upper side of the FIG. 2(C) through chemical vapor deposition, vacuum evaporation or sputtering process. The thickness of 3000 to 8000A is chosen to make these into leads for the source and drain. Also, masking material such as tungsten, platinum and silicon nitride is put on the surface of the above coating to resist anode oxidation or thermal oxidation. The tungsten and platinum coatings are formed by sputtering and silicon nitride is deposited by chemical vapor deposition. It is possible to get a substantially flat top surface at the step (D) of FIG. 2 by making the layer 9 relatively thin and the layer 15 thick. Then, the coating 15 above the coating 9 on the gate in Step (D) of FIG. 2 and the areas of the coating 15 except that on the coating 9 for leads and electrodes are removed by photo-etching process. Then, anode oxidation is applied for the remainder except the above portion by photo-resist and masking coating 15.

For the anode oxidation the substrate is operated as an anode using a constant current source and alcohol, oxalic acid or formic acid is used as the solution. The alcohol was the best solution in this embodiment. The voltage between the anode and cathode changes by several hundred volts starting near zero volts in proportion to the thickness of the coating 10 by the oxidation. After a complete portion of coating 10 is obtained, the oxidation is stopped. In general, porous coating 10 makes oxidation easy.

The completed coating has a masking effect against alkali ions penetrating into the gate because the completed coating 10 is aluminum oxide, chromium oxide or titanium oxide. At the same time, alkali ions such as sodium are attracted to the facing negative electrode thereby augmenting the reliability. The value of this current may change depending on the size of the substrate. Thus, a portion of coating 10 changes into an oxidized coating as shown on the Step (E) and the periphery of the gate is made of a different insulating material from the gate material.

It is also possible to make the source and drain using the same conductive type as the gate electrode. For example, a $p^{++}$ type highly doped silicon gate is used when the $P^{++}$ type source and drain is made for a P-channel MISFET. However, a coating having a masking effect such as of tungsten, platinum or silicon nitride should be processed on the silicon electrode.

After the fabrication of the gate, a portion of the coating 9 is to be oxidized except the gate electrode 6 and the lead 12, 11 of source 13 and drain 14. This step in the fabrication improves reliability. The FIG. 4(A) shows the oxidized portion with oblique lines.

P-type conductors are required for the lead to be made of doped silicon and the insulator 10 to be processed through anode oxidation. An N-type conductor is required for the coating of the insulator 10, if the coating is to be processed through thermal oxidation by heating wet oxygen or moisture at the temperature of 900°C to 1100°C. In case of fabrication of the insulator coating 10 by the thermal oxidation, Step (C) of FIG.

2, a diffusion process for the source and drain is not required. As shown in the Step (E) of FIG. 2, upon heating of the insulator coating at the temperature 950°C to 1100°C, P-type or N-type impurities highly doped in the polycrystalline silicon coating 9 having the opposite conductivity to said semiconductor substrate or layer 16, diffuse into the layer 16 to form source 13 and drain 14. In this embodiment, no special diffusion or ion implantation process to make the source 13 and drain 14, is necessary. The steps shown on the drawing can be reduced by at least one step for the above reason.

Figure 4:
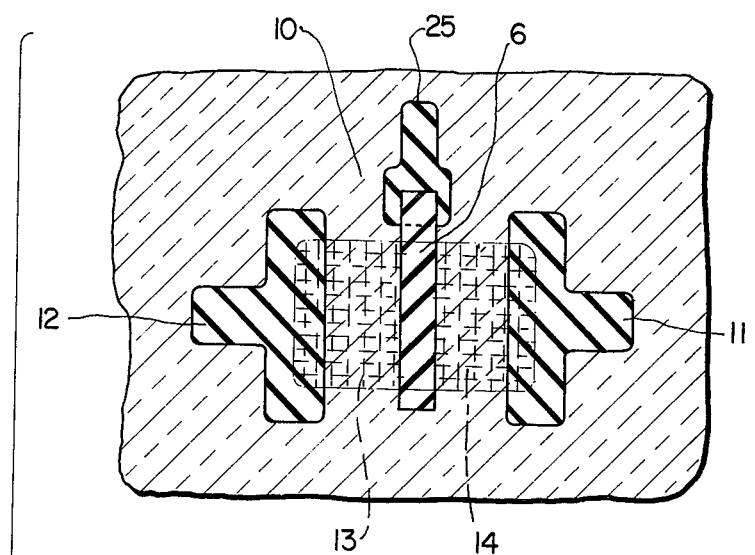
FIG. 4 (A, B) shows greatly enlarged plan views of FIG. 2(E) and FIG. 3(D).
Figure 4:
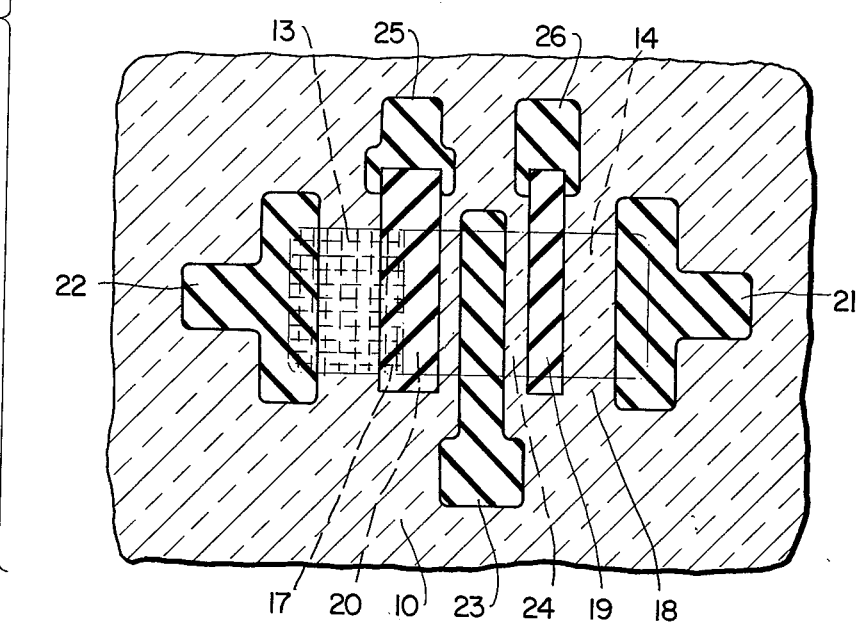

The basic form corresponding to the final structure is shown in Step (E) of FIG. 2 and the corresponding plan view is shown in FIG. 4(A).

The peripheral portion of the semiconductor active element has a separate dielectric material 2 reducing the stray capacitance that exists between the lead and the substrate. The substrate 1 separates the semiconductor active element layer 16 by inverse P-N biasing providing the reduction of stray capacitance at the drain. The sizes of the source 13 and the drain 14 are determined by the gate and the layer 2. The position for the gate 6 is not critical as shown on the FIG. 3(A). Also, the locations for the source lead 12 and the drain lead 11 are not critical as shown on the FIG. 3(A). The present FET requires three masks during fabrication. This elminates the opening step for the source and the drain electrodes in addition to the reduction of the time for the photo-masking process. Also, the residual conductor, i.e., the unnecessary portions of the lead and the electrode, is changed to an insulator by chemical reaction. This produces a lower-part for the multi-layer wiring structure and a coating to prevent deterioration. Thus, the production rate increases yielding good quality.

In addition, the present invention can adjust the thickness for the portion of the leads 11 and 12. It is easy to apply double layers on multi-layers wiring above the device as shown in FIG. 2(E). The above features are good for LSI particularly, making the required chip area half of that for the conventional silicon-gate MISFET.

EMBODIMENT 3

Figure 3:
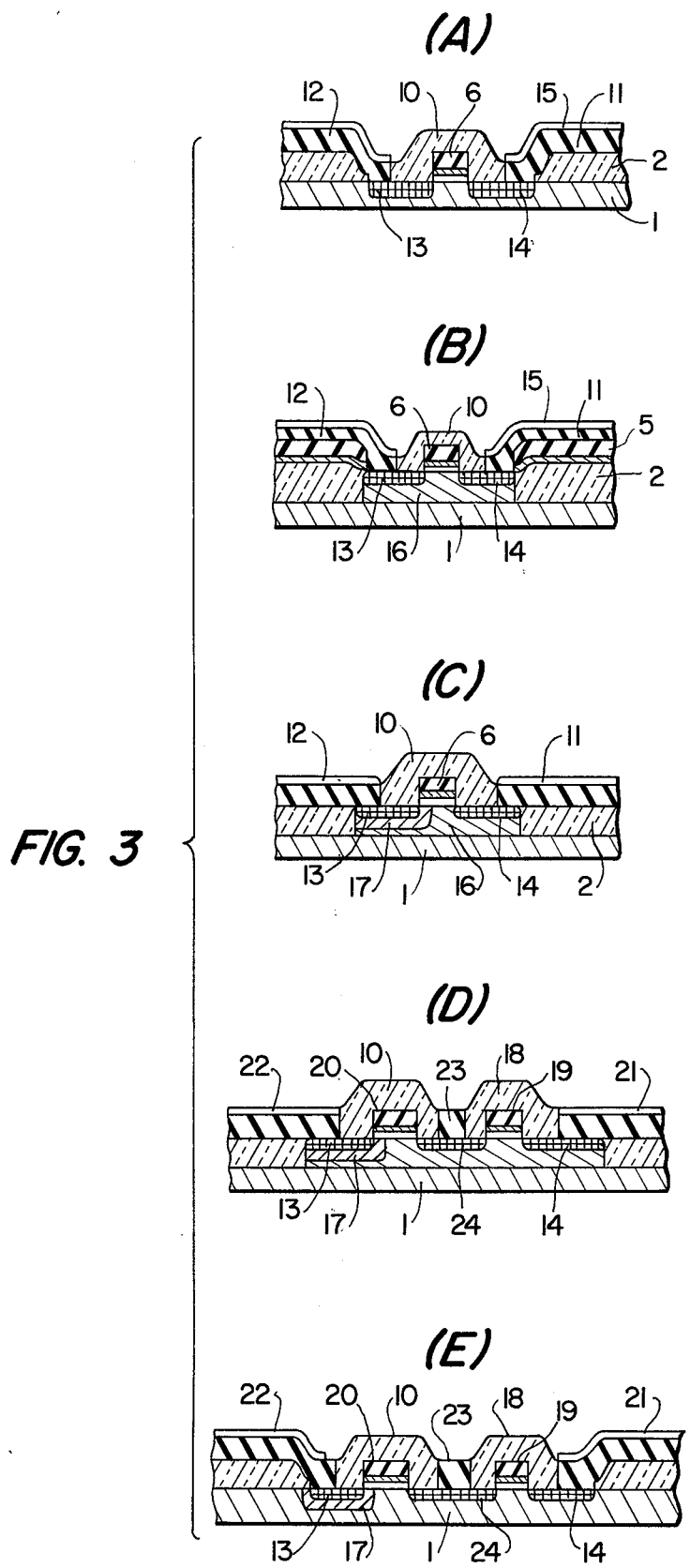
FIG. 3 (A–E) shows greatly enlarged cross sections of the steps of another embodiment of the process.

FIG. 3 shows a modification for the FIG. 1(A) as a DSA(diffusion-self-aligned type) MISFET or as an invertor combining these two. The step (A) of FIG. 3 has the coating 2 processed through the CVD by reaction by silane and oxygen or a thermal oxidation by high-temperature wet oxygen or water vapor to reduce a stray capacitance existing between the leads 11, 12 and the substrate 1. The source 13, the drain 14, the gate 6, the insulator 2 for the periphery of the gate 10, etc. are the same as in FIG. 1.

The depletion-mode is preferable. However the enhancementmode can be used if the gate is connected to either the source or drain at some point. For this, the oxide insulating layer 10 is processed at the periphery for the gate leaving a portion unoxidized to be connected to source 13 and drain 14.

FIG. 3(B) utilizes a combination of Step (E) of FIGS. 1 and 2. Although precision masking is required for this, it reduces a sheet resistance for the lead.

FIG. 3(C) has the same structure as FIG. 2(E) except for the base region of self diffused layer 17 making up the channel which requires masking the source 13. Then, this requires a total of four maskings. For the fabrication of an IC, (Integrated Circuits), having the enhancement-mode MISFET, isolation is essential. Thus, the structure shown in FIG. 3(C) is very effective for this.

The conductivity type relative to the substrates are: (1) $N^-$ or $P^-$, (17) or $P^+$ or $N^+$ and (13) (14) $N^{++}$, respectively. Also, they are: (1) N or P, (17) P or N and (13) (14) $N^+$ or $P^+$, respectively.

FIG. 3(D) shows an invertor consisting of the step (C) and Step (E) of FIG. 2 combining a driver of the enhancementmode DSAMISFET 20 and a load of the depletion mode MISFET 19. In FIG. 3(D) and (E), driver MISFET 20 has the source lead 22 electrically connected to source 13 and the drain lead 23 which is the same as the source lead of load MISFET 19 electrically connected to drain 24 of the driver MISFET 20 and the source 24 of the load MISFET 19. The lead 21 is connected to the drain 14 of load MISFET 19. The periphery of both gate and lead of both MISFETS 20, 19 are covered by the insulating coating 10, 18 by the oxidation of the same material of leads such as FIG. 3(C) and FIG. 2(E). The plan view of this is shown in FIG. 4(B) using the same reference number. The numeral 23 is for the output terminal, the 24 is part drain for the driver of the DSAMISFET and the source for the lead of the MISFET 19. In FIG. 4(B) the gate electrodes of the driver and load MISFET 20, 19 are also electrically connected by the leads 25, 26 respectively, in which the lead material is the same as the lead of 22 21 of source 13 and drain 14. The periphery of leads 21, 22, 25, 26 shown as oblique lines are insulating coatings 10, 18.

The FIGS. 3(E) shows an invertor combining FIG. 3(A) and the DSAMISFET having the same structure. The referenced numbers are the same as in FIG. 3(D).

The present invention provides an ideal structure for a MISFET and it is believed that it contributes to the industry and to the progress of the technology of integrated circuits and of large scale integrated circuits.

I claim:

1. A method for making a semiconductor structure having at least two diffused regions of one conductive type in a semiconductor substrate, which comprises: forming an insulating layer on said substrate, etching away a portion of said insulating layer, diffusing impurities into said exposed portions of said semiconductor substrate to form said diffused regions, forming a selectively oxidized conductor layer on said diffused regions and said insulating layer by forming a mask selectively on such conductor layer, and fully oxidizing the unmasked portion by anodic oxidation and simultaneously making conductive leads of said masked portion of said conductor layer on said insulating layer and electrodes of said unmasked portion of said conductor layer contacting with said diffused regions.

2. The method as defined in claim 1, wherein an insulating layer is formed at the periphery of said source and drain.

3. A method as defined in claim 2, wherein the step of forming an insulating layer is carried out using silicon nitride.

4. A method as claimed in claim 1 further comprising the step of coating the gate region with silicon nitride.

5. A method for manufacturing a semiconductor field effect transistor including at least two conductively separated regions formed in a semiconductor substrate so as to define a channel therebetween, said regions having opposite conductivity type to said substrate and providing a source junction and drain junction, and a gate electrode spaced in said channel near the surface of said semiconductor substrate, which method includes the steps of: forming at least one insulating layer on said semiconductor substrate; forming at least one conductive layer over said insulating layer; providing openings to the source and drain respectively by removing selected portions of said insulating and conductive layers, with the remnants of said insulating and conductive layers left between said openings forming said gate insulator and gate electrode; coating the resulting surface with highly doped polycrystalline silicon having the opposite conductivity to said semiconductor substrate; masking portions of the above surface of highly doped polycrystalline silicon, which masked portions are uitlized for the source and drain electrodes and leads, the unmasked portion thereof defining a central portion of said highly doped polycrystalline silicon overlying said gate electrode and said source and drain; thermally oxidizing the unmasked portion of said highly doped polycrystalline silicon until said electrodes and leads are electrically isolated from each other, and simultaneously diffusing impurities into the semiconductor substrate in order to form said source and drain junctions.

6. A method making a semiconductor field effect transistor including at least two conductively separated regions formed in a semiconductor substrate so as to define a channel therebetween, said regions having opposite conductivity type to said substrate and providing a source junction and drain junction, and a gate electrode spaced in said channel near the surface of said semiconnector substrate, which method includes the steps of:

forming at least one insulating layer on said semiconductor substrate; forming at least one conductive layer over said insulating layer; providing openings for said source and drain respectively by removing selected portions of said insulating and conductive layers, the remnants of said insulating layer and said conductive layer left between said openings forming said gate insulator and gate electrode; diffusing highly doped impurities of opposite conductivity to the conductivity of the semiconductor substrate into the semiconductor substrate from said provided openings for source and drain; forming a conductor coating selected from the group consisting of aluminum, titanum and silicon over the resulting structure, which coating is to be used for the source and drain electrodes and leads, and for an insulator surrounding the gate electrode; masking portions of said conductor coating, which portions form said electrodes and leads to the source and drain, the unmasked portion defining a central portion of said conductor coating overlying said gate electrode and said source and drain; performing anodic oxidation of said central portion of said conductor coating in order to isolate said electrodes and leads from each other electrically and form said insulator surrounding said gate electrode.

7. A method for manufacturing a semiconductor field effect transistor including at least two conductively separated regions formed in a semiconductor substrate so as to define a channel therebetween, said regions having opposite conductivity type to said substrate and providing a source junction and drain junction, and a gate electrode spaced in said channel near the surface of said semiconductor substrate, and an insulator covering said gate electrode, which method includes the steps of:

forming at least one insulating layer on said semiconductor substrate; forming at least one conductive layer over said insulating layer; forming at least one source, base and drain having a conductivity type, relative to substrate of $N^-$, of a base of $P^+$, and a source and drain of $N^{++}$ respectively; forming a conductor coating selected from the group consisting of aluminum, titanium and silicon over the resulting structure, which coating is to be used for the source and drain electrodes and leads, and for an insulator surrounding the gate electrode; masking portions of the conductor coating, which portions form said electrodes and leads to the source and drain, the unmasked portion defining a central portion of said conductor coating overlying said gate electrode and said source and drain; performing anodic oxidation of said central portion of said conductor coating in order to isolate said electrodes and leads from each other electrically and form said insulator surrounding said gate electrode.

* * * * *